(12) United States Patent
Chou et al.

(10) Patent No.: US 12,051,626 B2
(45) Date of Patent: Jul. 30, 2024

(54) FIN FIELD-EFFECT TRANSISTOR AND METHOD OF FORMING THE SAME

(71) Applicant: Taiwan Semiconductor Manufacturing Company, Ltd., Hsinchu (TW)

(72) Inventors: Chun-Cheng Chou, Taichung (TW); Ying-Liang Chuang, Zhubei (TW); Chun-Neng Lin, Hsinchu (TW); Ming-Hsi Yeh, Hsinchu (TW); Kuo-Bin Huang, Jhubei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 531 days.

(21) Appl. No.: 17/460,106

(22) Filed: Aug. 27, 2021

(65) Prior Publication Data

US 2023/0068714 A1   Mar. 2, 2023

(51) Int. Cl.
| | | |
|---|---|---|
| *H01L 21/82* | (2006.01) | |
| *H01L 21/033* | (2006.01) | |
| *H01L 21/311* | (2006.01) | |
| *H01L 21/8234* | (2006.01) | |

(52) U.S. Cl.
CPC .. *H01L 21/823431* (2013.01); *H01L 21/0337* (2013.01); *H01L 21/31111* (2013.01); *H01L 21/31116* (2013.01); *H01L 21/31133* (2013.01)

(58) Field of Classification Search
CPC ......... H01L 21/823431; H01L 21/0337; H01L 21/31111; H01L 21/31116; H01L 21/31133; H01L 21/3105; H01L 21/32139
USPC ........................................ 438/283
See application file for complete search history.

(56) References Cited

U.S. PATENT DOCUMENTS

| | | | | |
|---|---|---|---|---|
| 5,741,628 | A  * | 4/1998 | Matsuo ............... | H01L 21/0275 430/323 |
| 2009/0134119 | A1* | 5/2009 | Matsumaru ....... | H01L 21/31144 216/49 |
| 2017/0186614 | A1* | 6/2017 | Ko .......................... | G03F 7/405 |
| 2021/0013110 | A1* | 1/2021 | Mun ............... | H01L 21/823821 |

* cited by examiner

*Primary Examiner* — Mohammad M Hoque
(74) *Attorney, Agent, or Firm* — FOLEY & LARDNER LLP

(57) ABSTRACT

A method for manufacturing a semiconductor device includes forming one or more work function layers over a semiconductor structure. The method includes forming a hardmask layer over the one or more work function layers. The method includes forming an adhesion layer over the hardmask layer. The method includes removing a first portion of a patternable layer that is disposed over the hardmask layer. The adhesion layer comprises an organic acid that concurrently bonds metal atoms of the hardmask layer and phenol groups of the patternable layer, thereby preventing an etchant from penetrating into a second portion of the patternable layer that still remains over the hardmask layer.

20 Claims, 19 Drawing Sheets

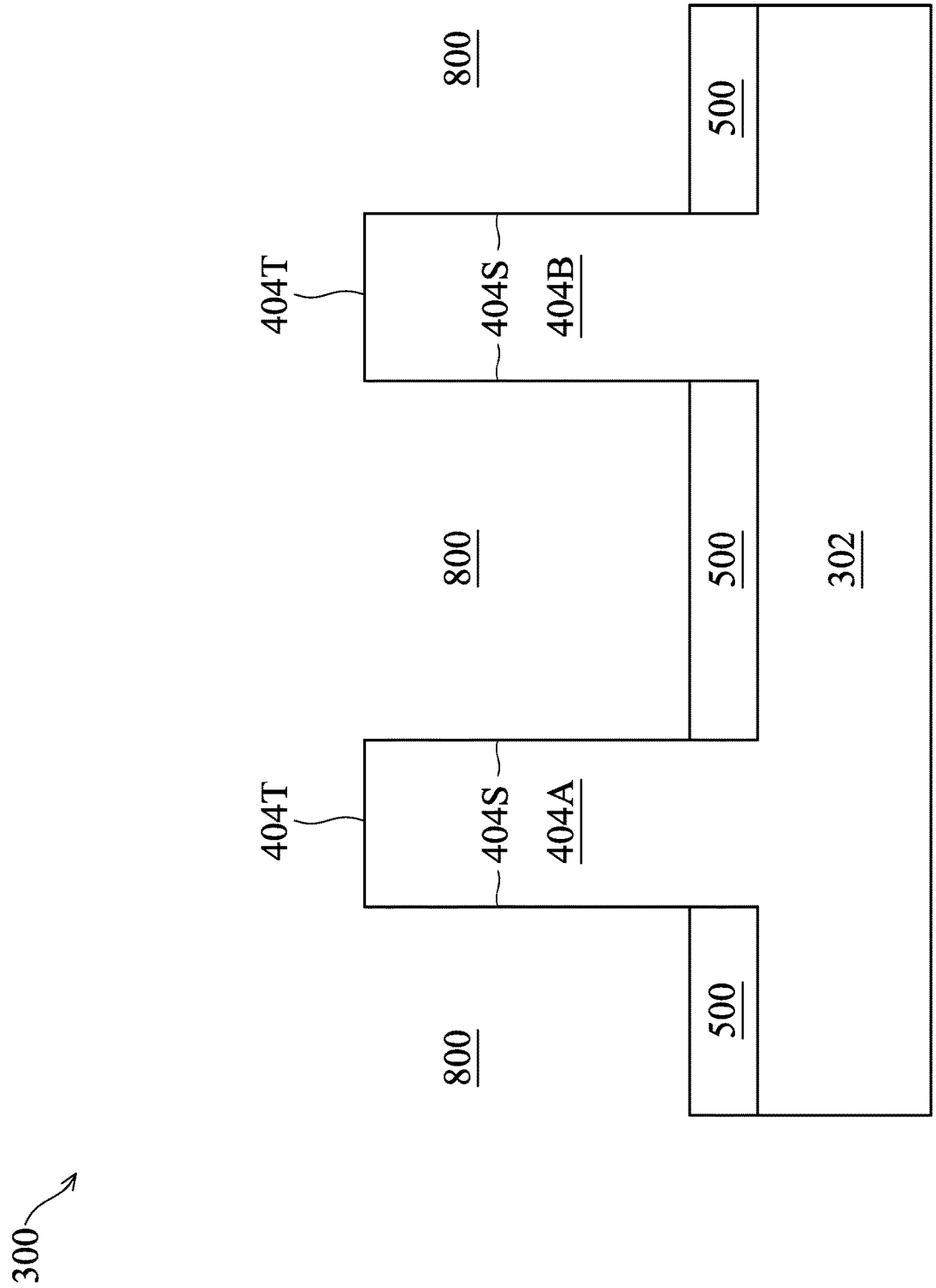

FIN FIELD-EFFECT TRANSISTOR AND METHOD OF FORMING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8A, 8B, 9, 10, 11, 12, 13, 14, 15, and 16 illustrate cross-sectional views of an example FinFET device (or a portion of the example FinFET device) during various fabrication stages, made by the method of FIG. 2, in accordance with some embodiments.

DETAILED DESCRIPTION

Figure 1:
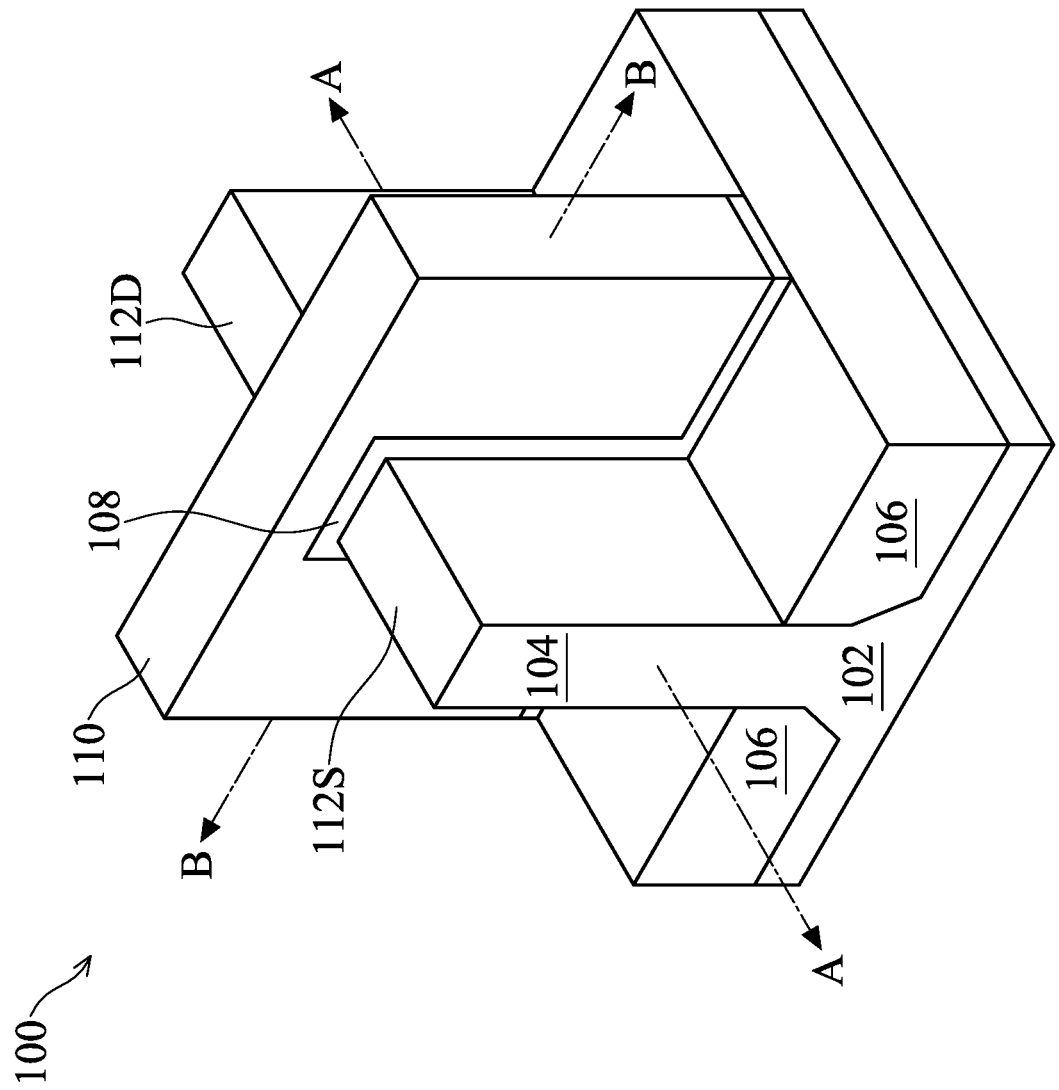
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to have multiple threshold voltages for respective FinFETs, different combinations of one or more work function layers are formed over fin structures that partially function as respective (metal) gate structures. To achieve such different combinations of work function layers, one or more etching processes are typically performed to etch back one or more of the work function layers over a first group of the fin structures, while the work function layers over a second group of the fin structures remain intact. In general, the work function layers over the second group of fin structures are protected or otherwise overlaid by a patternable (or patterned) layer covering the topmost work function layer, which is sometimes referred to as a hardmask layer. In existing technologies, while etching the work function layers over the first group of fin structures, etchants (e.g., wet chemicals) can penetrate through the patternable layer, for example, through an interface between the hardmask layer and the patternable layer. This can result in undesired loss of the work function layers over the second group. Consequently, the threshold voltages (e.g., of the FinFETs adopting the second group) may not be accurately controlled.

Embodiments of the present disclosure are discussed in the context of forming a FinFET device, and in particular, in the context of forming a replacement gate of a FinFET device. For example, the present disclosure provides various embodiments of a FinFET device, which is immune from the above-identified issues, and methods to form the same. In some embodiments, prior to forming the patternable layer, an adhesion layer is formed over the hardmask layer. The adhesion layer includes a functional group such as, for example, an organic acid. Such an organic acid can concurrently bond metal atoms of the hardmask layer and phenol groups of the patternable layer, in various embodiments. With the adhesion layer, the patternable layer can bond to the hardmask layer more firmly, which can significantly lower the possibility of etchants penetrating through the interface (between the hardmask layer and the patternable layer). Different combinations of the work function layers (through a number of etching back processes) can be formed, while not inducing any undesired loss of the work function layers. Consequently, the threshold voltages for different FinFETs can be accurately controlled.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source/drain structures 112S and 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain structures 110. Subsequent figures refer to these reference cross-sections for clarity.

Figure 2:
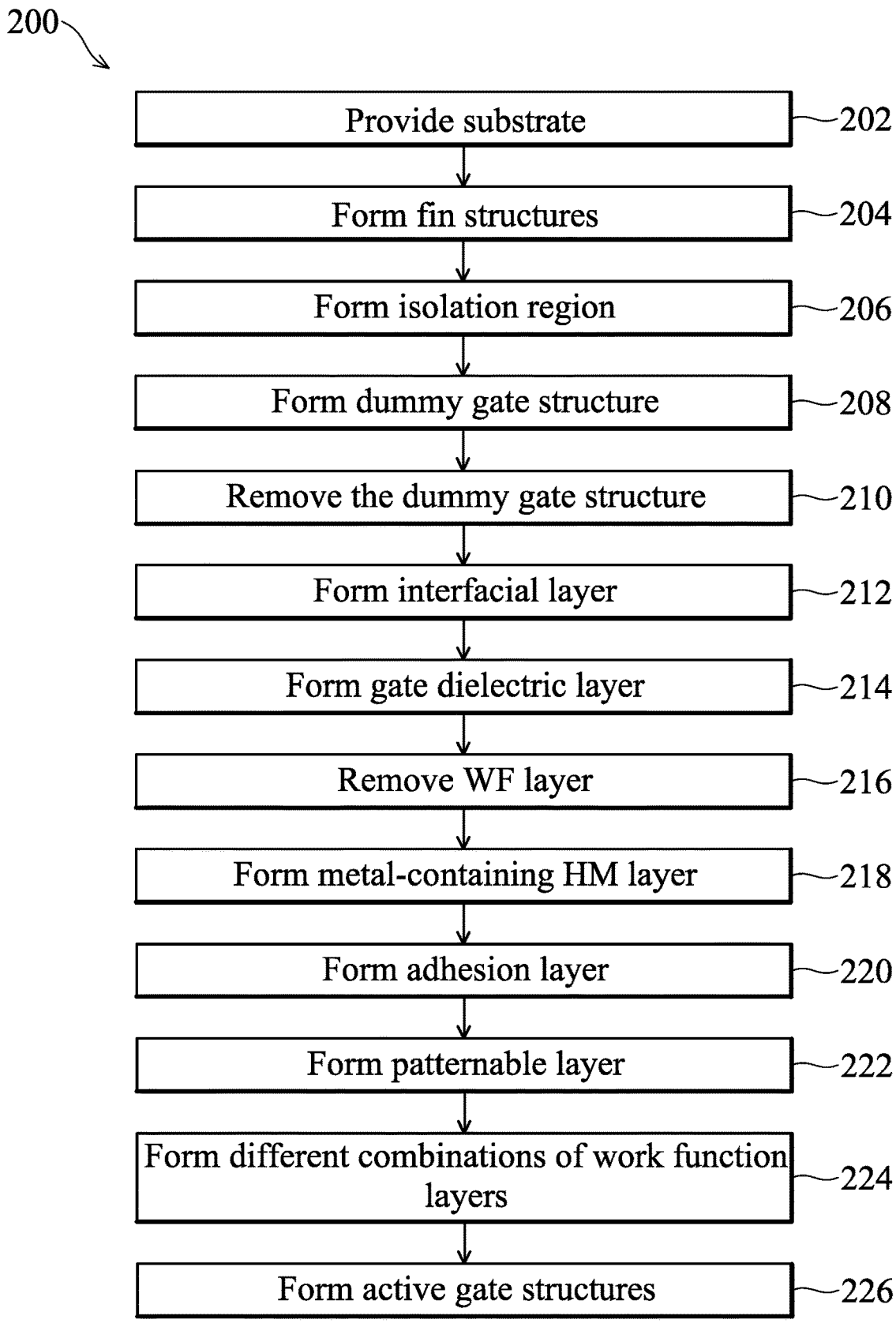
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations of the method 200 can be used to form a FinFET device (e.g., FinFET device 100), a nanosheet transistor device, a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8A, 8B, 9, 10, 11, 12, 13, 14, 15, and 16, respectively, which will be discussed in further detail below.

In brief overview, the method 200 starts with operation 202 of providing a substrate. The method 200 continues to operation 204 of forming fin structures. The method 200 continues to operation 206 of forming an isolation region. The method 200 continues to operation 208 of forming a dummy gate structure. The dummy gate structure may straddle a respective portion of each of the fin structures. The method 200 continues to operation 210 of removing the dummy gate structure. Upon the dummy gate structure being removed, a gate trench is formed. The method 200 continues to operation 212 of forming an interfacial layer. The method 200 continues to operation 214 of forming a gate dielectric layer. The method 200 continues to operation 216 of forming a work function layer. The method 200 continues to operation 218 of forming a metal-containing hardmask layer. The method 200 continues to operation 220 of forming an adhesion layer. The method 200 continues to operation 222 of forming a patternable layer. The method 200 continues to operation 224 of forming different combinations of one or more work function layers. The method 200 continues to operation 226 of forming a number of active gate structures.

As mentioned above, FIGS. 3-16 each illustrate, in a cross-sectional view, a portion of a FinFET device 300 at various fabrication stages of the method 200 of FIG. 2. The FinFET device 300 is substantially similar to the FinFET device 100 shown in FIG. 1. Although FIGS. 3-16 illustrate the FinFET device 300, it is understood the FinFET device 300 may include a number of other devices such as inductors, fuses, capacitors, coils, etc., which are not shown in FIGS. 3-16, for purposes of clarity of illustration.

Figure 3:
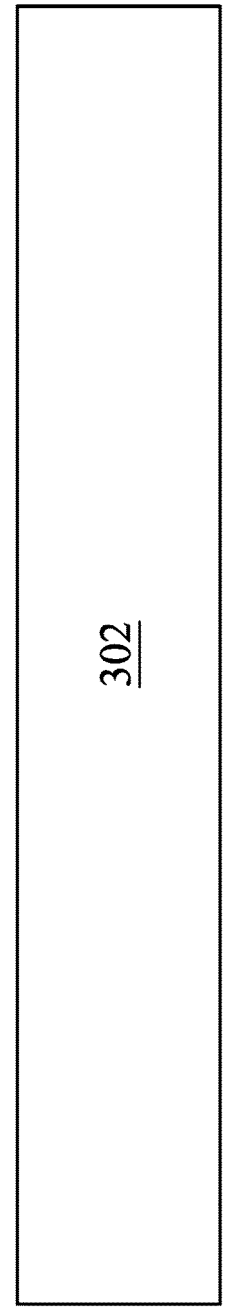

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of a dummy or an active gate structure (e.g., cross-section B-B, as indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
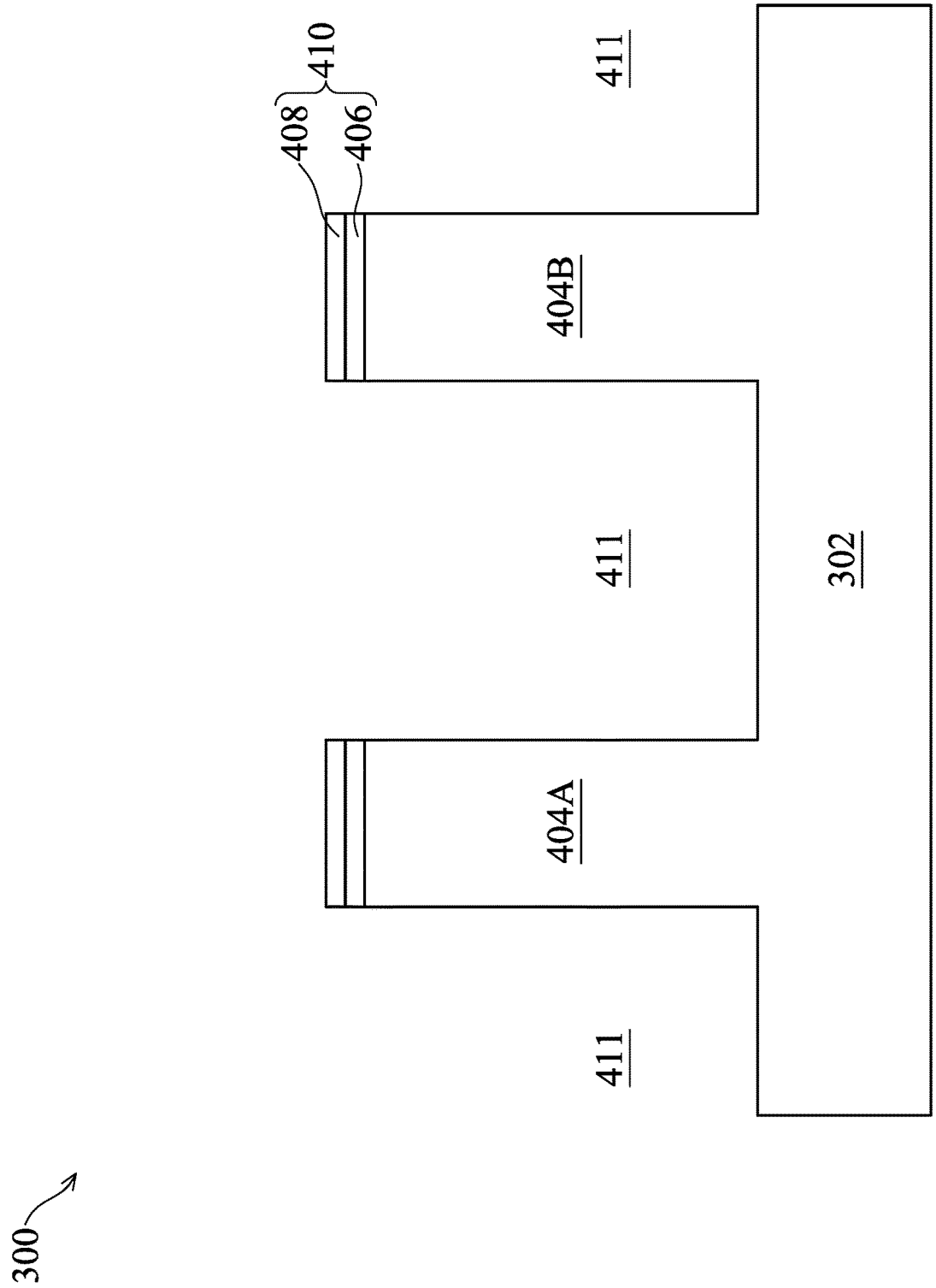

Corresponding to operation 204 of FIG. 2, FIG. 4 is a cross-sectional view of the FinFET device 300 including (semiconductor) fin structures 404A and 404B at one of the various stages of fabrication. The cross-sectional view of FIG. 4 is cut along the lengthwise direction of a dummy or an active gate structure (e.g., cross-section B-B, as indicated in FIG. 1).

Although two fin structures are shown in the illustrated embodiment of FIG. 4 (and the following figures), it should be appreciated that the FinFET device 300 can include any number of fin structures while remaining within the scope of the present disclosure. In some embodiments, the fin structures 404A-B are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining a fin structure (e.g., 404A, 404B) between adjacent trenches 411 as illustrated in FIG. 4. When multiple fin structures are formed, such a trench may be disposed between any adjacent ones of the fin structures. In some embodiments, the fin structures 404A-B are formed by etching trenches in the substrate 302 using, for example, reactive ion etch (ME), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround each of the fin structures 404A-B. The fin structures 404A-B may sometimes be referred to as fin 404 hereinafter.

The fin 404 may be patterned by any suitable method. For example, the fin 404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Figure 5:
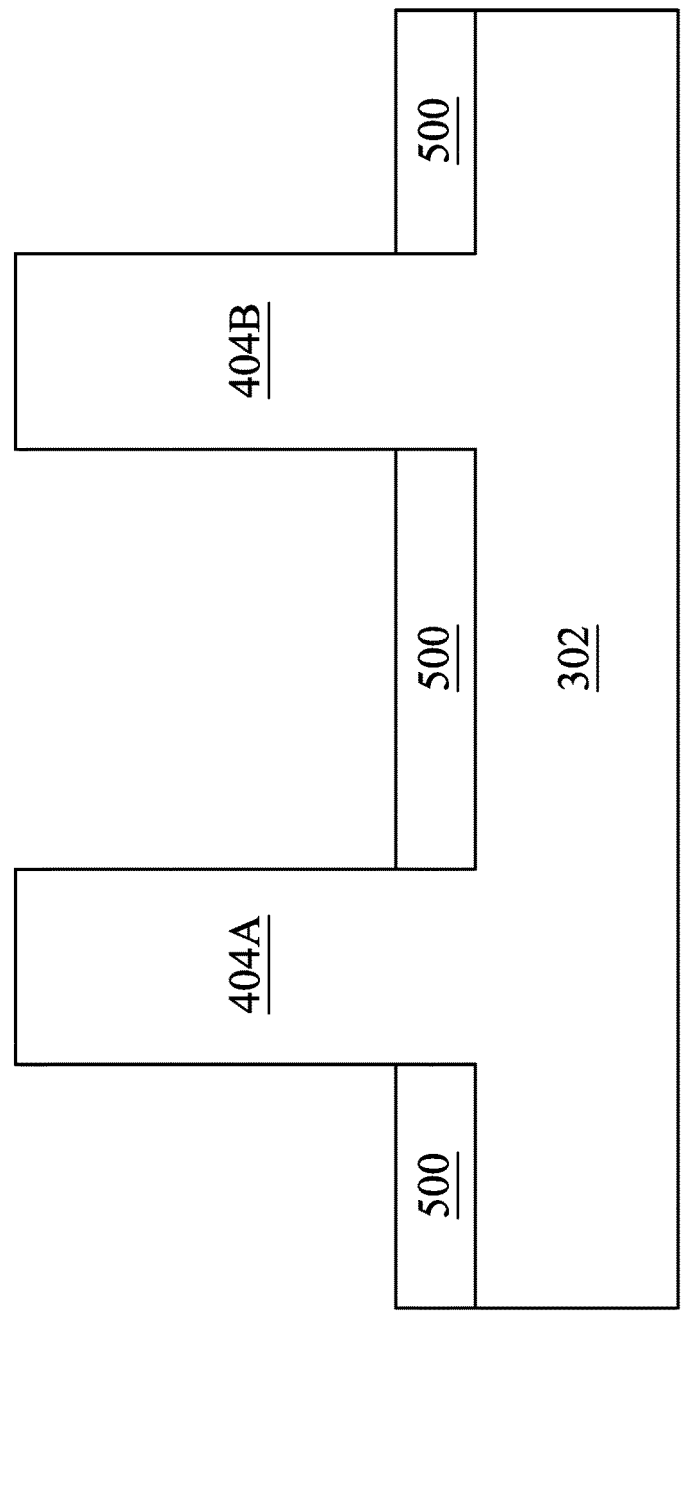

Corresponding to operation 206 of FIG. 2, FIG. 5 is a cross-sectional view of the FinFET device 300 including isolation regions 500 at one of the various stages of fabrication. The cross-sectional view of FIG. 5 is cut along the lengthwise direction of a dummy or an active gate structure (e.g., cross-section B-B, as indicated in FIG. 1).

The isolation regions 500, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and a top surface of the fin 404 that are coplanar (not shown). The patterned mask 410 (FIG. 4) may also be removed by the planarization process.

In some embodiments, the isolation regions 500 include a liner, e.g., a liner oxide (not shown), at the interface between each of the isolation regions 500 and the substrate 302 (fin 404). In some embodiments, the liner oxide is formed to reduce crystalline defects at the interface between the substrate 302 and the isolation region 500. Similarly, the liner oxide may also be used to reduce crystalline defects at the interface between the fin 404 and the isolation region 500. The liner oxide (e.g., silicon oxide) may be a thermal oxide formed through a thermal oxidation of a surface layer of the substrate 302, although other suitable method may also be used to form the liner oxide.

Next, the isolation regions 500 are recessed to form shallow trench isolation (STI) regions 500, as shown in FIG. 5. The isolation regions 500 are recessed such that the upper portions of the fin 404 protrude from between neighboring STI regions 500. Respective top surfaces of the STI regions 500 may have a flat surface (as illustrated), a convex surface, a concave surface (such as dishing), or combinations thereof. The top surfaces of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

FIGS. 3 through 5 illustrate an embodiment of forming the fin 404, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the fin 404 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fin 404 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
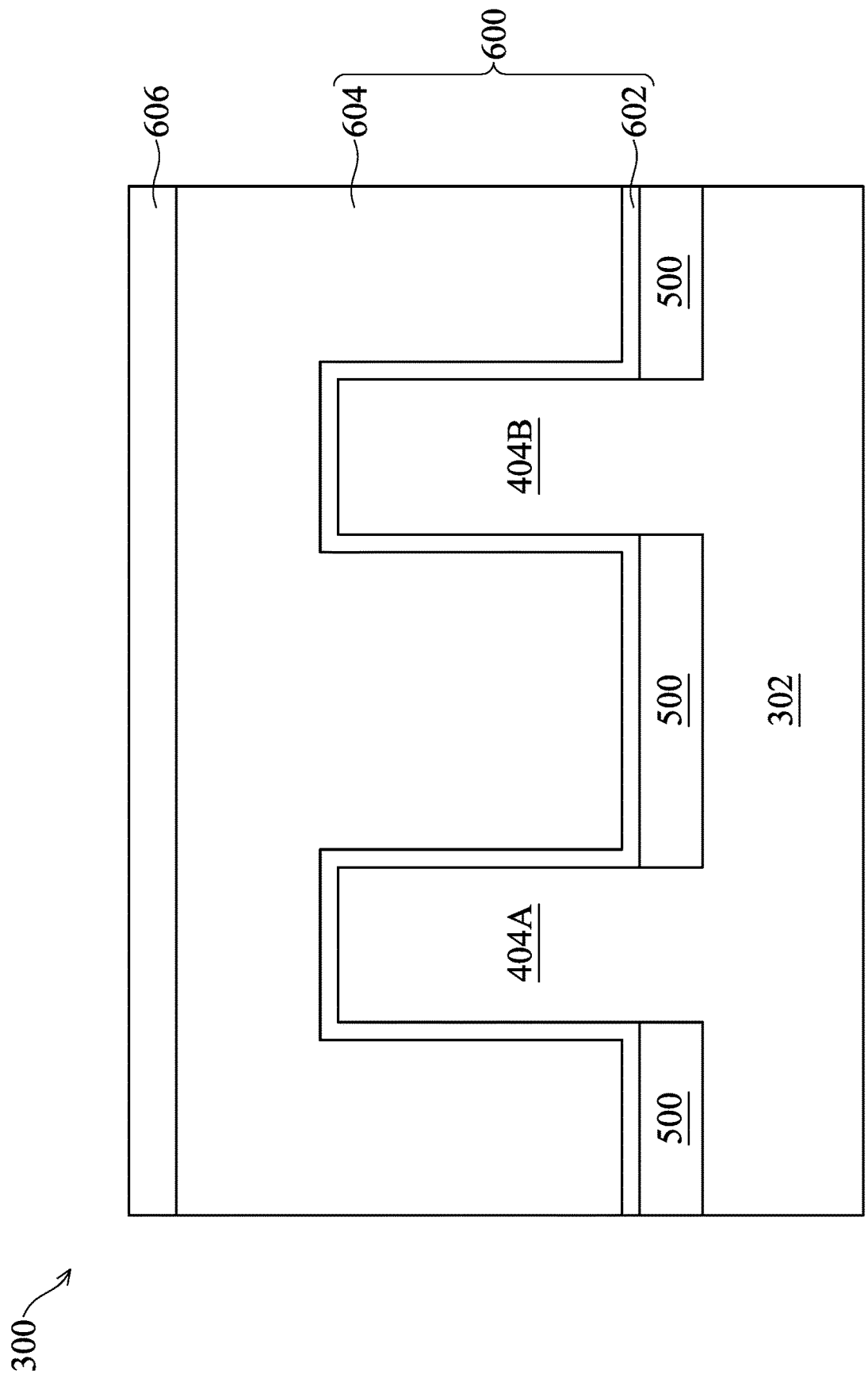

Corresponding to operation 208 of FIG. 2, FIG. 6 is a cross-sectional view of the FinFET device 300 including a dummy gate structure 600 at one of the various stages of fabrication. The cross-sectional view of FIG. 6 is cut along the lengthwise direction of a dummy or an active gate structure (e.g., cross-section B-B, as indicated in FIG. 1).

The dummy gate structure 600 includes a dummy gate dielectric 602 and a dummy gate 604, in some embodiments. A mask 606 may be formed over the dummy gate structure 600. To form the dummy gate structure 600, a dielectric layer is formed on the fin 404. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form the mask 606. The pattern of the mask 606 then may be transferred to the gate layer and the dielectric layer by an acceptable etching technique to form the dummy gate 604 and the underlying dummy gate dielectric 602, respectively. The dummy gate 604 and the dummy gate dielectric 602 cover a central portion (e.g., a channel region) of the fin 404. The dummy gate 604 may also have a lengthwise direction (e.g., direction B-B of FIG. 1) substantially perpendicular to a lengthwise direction (e.g., direction of A-A of FIG. 1) of the fin 404.

The dummy gate dielectric 602 is shown to be formed over the fin 404 (e.g., over top surfaces and sidewalls of each fin structures 404A-B) and over the STI regions 500 in the example of FIG. 6. In other embodiments, the dummy gate dielectric 602 may be formed by, e.g., thermal oxidation of a material of the fin 404, and therefore, may be formed over the fin 404 but not over the STI regions 500. It should be appreciated that these and other variations are still included within the scope of the present disclosure.

An example gate-last process (sometimes referred to as replacement gate process) is performed subsequently to replace the dummy gate structures 600 with an active gate structure (which may also be referred to as a replacement gate structure or a metal gate structure). Prior to removing the dummy gate structure 600, a number of features/structures may have been formed in the FinFET device 300. For example, a gate spacer disposed on sides of the dummy gate structure 600, source/drain structures formed in the fin 404 (e.g., on the sides of the dummy gate structure 600 with the gate spacer disposed therebetween), an interlayer dielectric (ILD) disposed over the source/drain structures, etc. Such structures will be briefly discussed in FIG. 7 that is a cross-sectional view of the FinFET device 300 cut along the lengthwise direction of one of the fin structures 404A (e.g., cross-section A-A, as shown in FIG. 1). The fin structure 404A has been selected as a representative example for the following figures cut along the cross-section A-A, and thus, it should be understood that over the fin structure 404B (and other non-shown fin structures), the FinFET device 300 can include similar features/structures.

Figure 7:
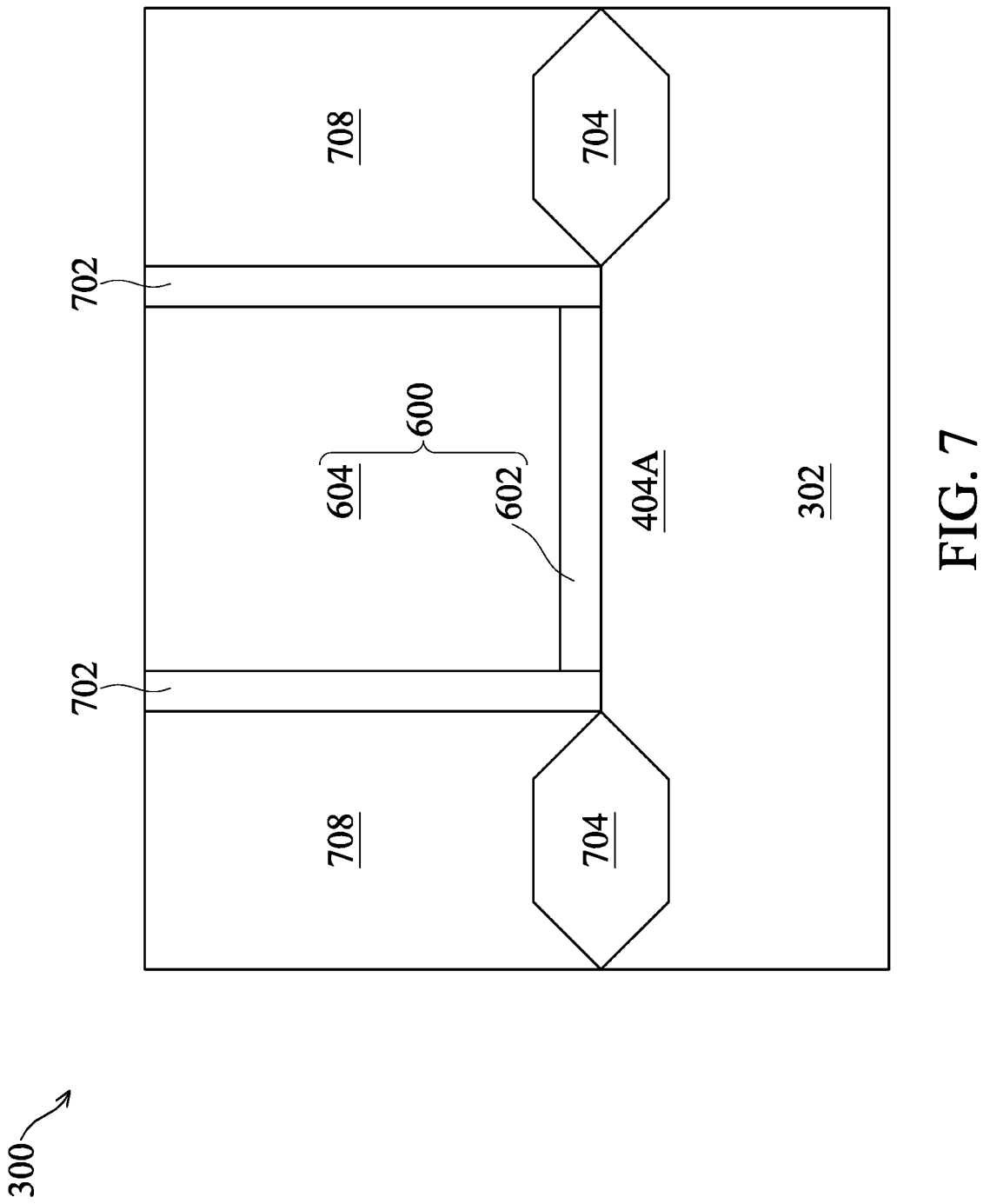

As shown in FIG. 7, the FinFET device 300 includes gate spacers 702 extending along sidewalls of the dummy gate structure 600. The gate spacer 702 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer. Separated from the dummy gate structure 600 by the gate spacers 702, source/drain structures 704 are formed in the fin structure 404A. The source/drain structures 704 are formed by epitaxially growing a semiconductor material in recesses of the fin structure 404A, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. After forming the source/drain structures 704, the ILD 708 is formed over the source/drain structures 704. The ILD 708 includes a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Figure 8B:
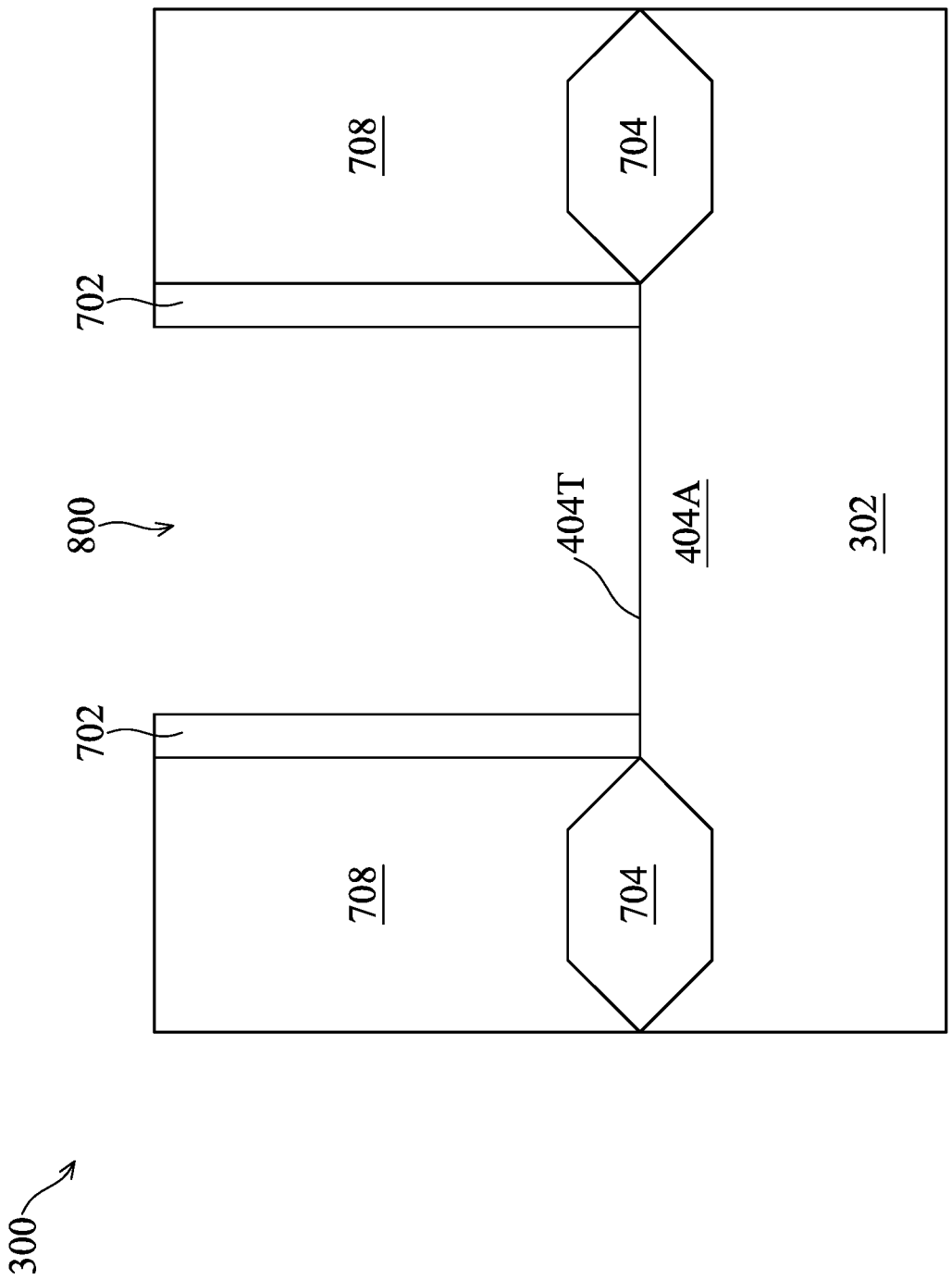

Corresponding to operation 210 of FIG. 2, FIG. 8A is a cross-sectional view of the FinFET device 300 in which the dummy gate structure 600 (FIG. 7) is removed to form a gate trench 800, at one of the various stages of fabrication. The cross-sectional view of FIG. 8A is cut along the lengthwise direction of a dummy or an active gate structure (e.g., cross-section B-B, as indicated in FIG. 1). Corresponding to the same operation, FIG. 8B is another cross-sectional view of the FinFET device 300 cut along the lengthwise direction of one of the fin structures 404A (e.g., cross-section A-A, as shown in FIG. 1).

To remove the dummy gate structure 600, one or more etching steps are performed to remove the dummy gate 604 and then the dummy gate dielectric 602, so that the gate trench 800 (which may also be referred to as a recess) is formed between the gate spacers 702 (as better illustrated in FIG. 8B). The gate trench 800 can expose a channel region of the fin structure 404 (e.g., 404A in FIG. 8B). During the dummy gate removal, the dummy gate dielectric 602 may be used as an etch stop layer when the dummy gate 604 is etched. The dummy gate dielectric 602 may then be removed after the removal of the dummy gate 604. Upon removing the dummy gate structure 600 (or forming the gate trench 800), a top surface 404T and sidewalls 404S of each of the fin structures 404 can be exposed, which can be better illustrated in the cross-sectional view of FIG. 8A.

Figure 9:
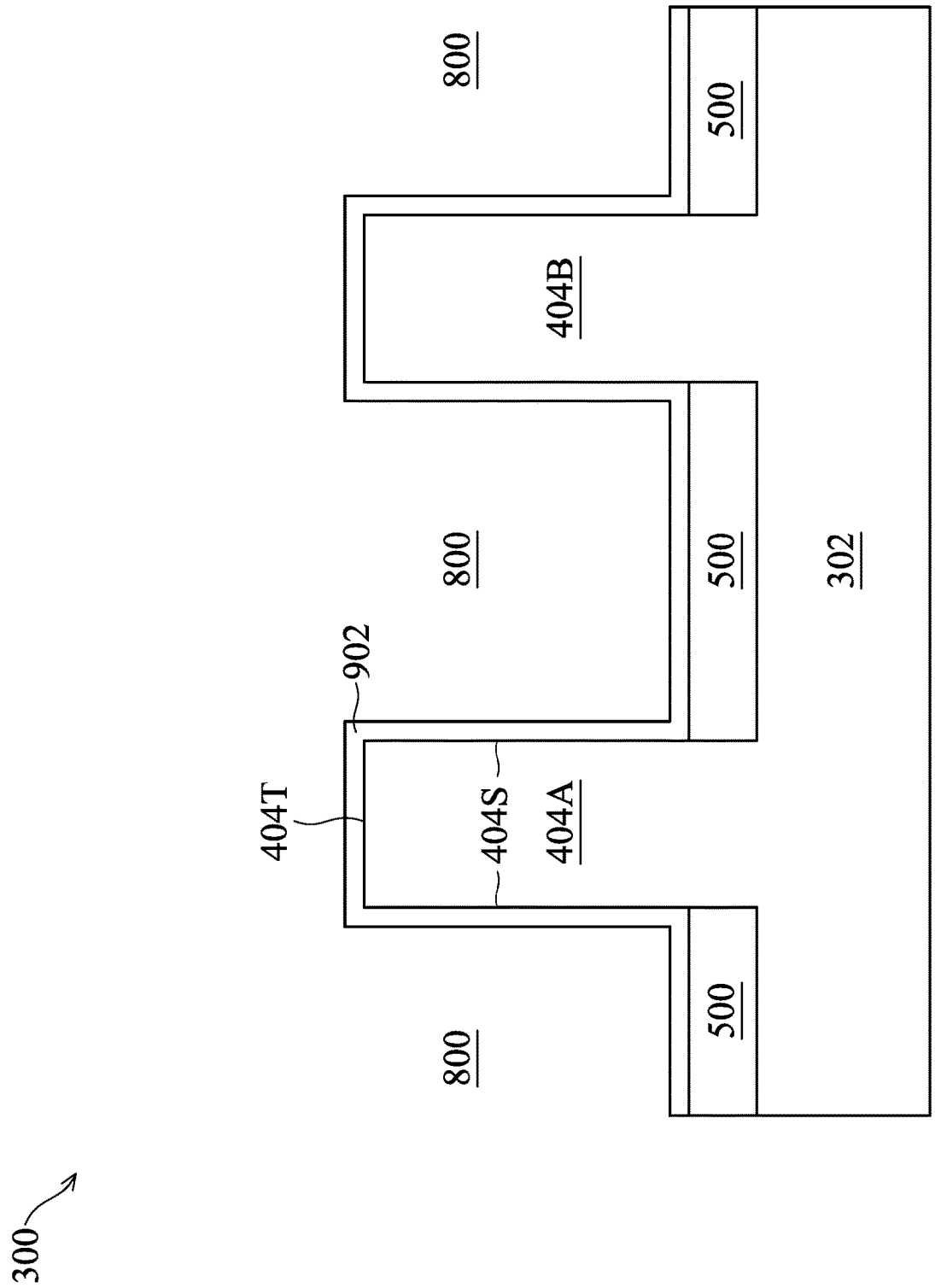

Corresponding to operation 212 of FIG. 2, FIG. 9 is a cross-sectional view of the FinFET device 300 including an interfacial layer 902, at one of the various stages of fabrication. The cross-sectional view of FIG. 9A is cut along the lengthwise direction of a dummy or an active gate structure (e.g., cross-section B-B, as indicated in FIG. 1).

The interfacial layer 902 may be (e.g., conformally) formed over the fin structures 404A-B. For example, the interfacial layer 902 can overlay the top surface 404T of each fin structure and extend along the sidewalls 404S of each fin structure, as shown in FIG. 9. The interfacial layer 902, which is formed of silicon oxide (e.g., $SiO_x$), can have a thickness ranging between 0.5 nanometers (nm) and about 2 nm, as an example. To form the interfacial layer 902, a wet chemical solution (e.g., $H_2SO_4$ mixed with $H_2O_2$) may be applied over the workpiece under an elevated temperature, e.g., between about 50° C. and about 150° C.

Figure 10:
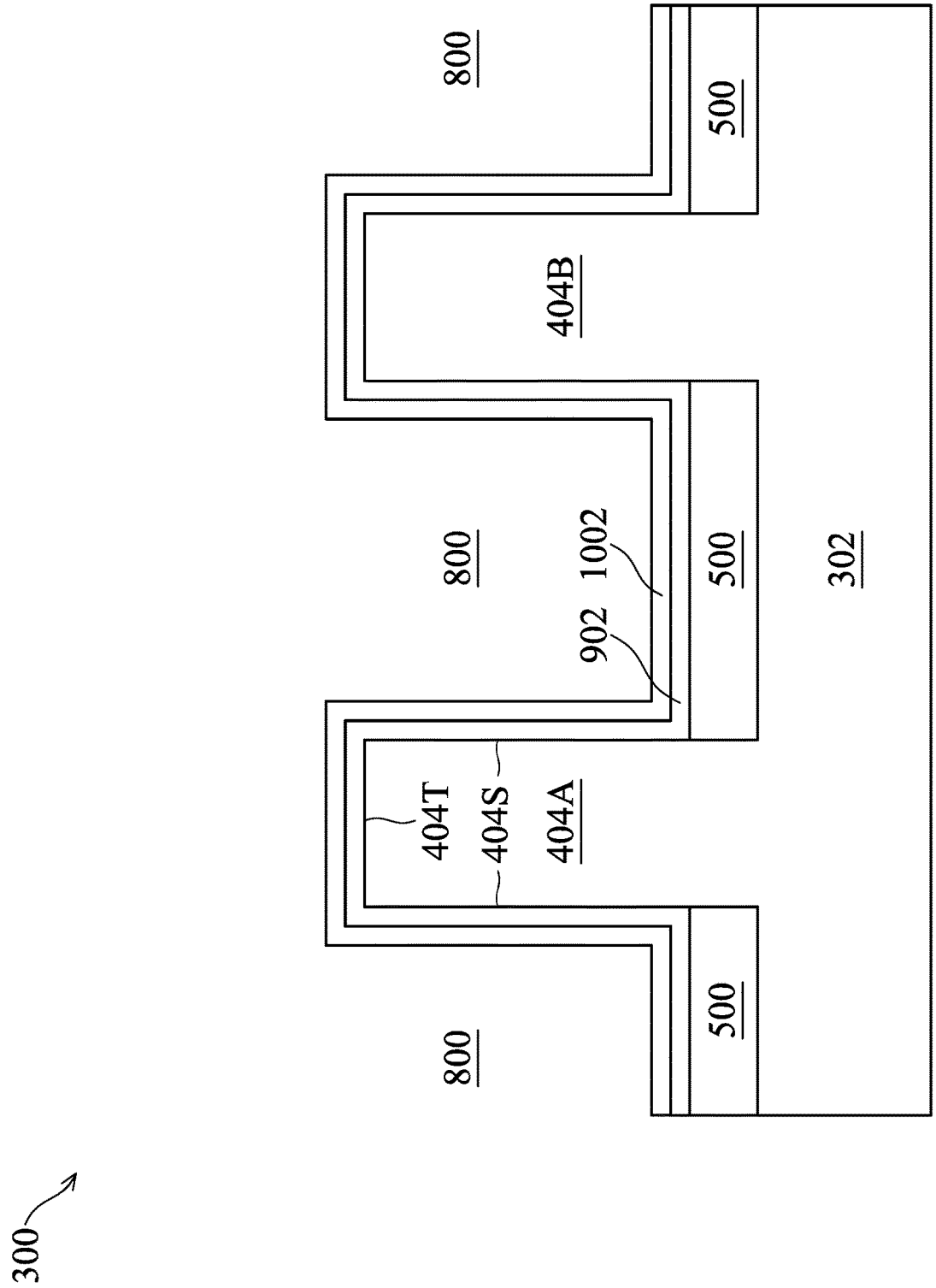

Corresponding to operation 214 of FIG. 2, FIG. 10 is a cross-sectional view of the FinFET device 300 including a gate dielectric layer 1002 at one of the various stages of fabrication. The cross-sectional view of FIG. 10 is cut along the lengthwise direction of a dummy or an active gate structure (e.g., cross-section B-B, as indicated in FIG. 1).

The gate dielectric layer 1002 is formed (e.g., deposited) conformally over the interfacial layer 902 in the gate trench 800. For example, with the interfacial layer 902 disposed therebetween, the gate dielectric layer 1002 is disposed, such as on the top surface and along the sidewalls of each fin structure 404A-B, and on respective top surfaces and along respective sidewalls of the gate spacers 702 and the ILD 708 (not shown in this cross-sectional view of FIG. 10). In accordance with some embodiments, the gate dielectric layer 1002 includes silicon oxide, silicon nitride, or multilayers thereof. In example embodiments, the gate dielectric layer 1002 includes a high-k dielectric material, and in these embodiments, the gate dielectric layers 1002 may have a k value greater than about 7.0, and may include a metal oxide or a silicate of Hf, Al, Zr, La, Mg, Ba, Ti, Pb, or combinations thereof. The formation methods of gate dielectric layer 1002 may include molecular beam deposition (MBD), atomic layer deposition (ALD), PECVD, and the like. A thickness of the gate dielectric layer 1002 may be between about 8 angstroms (Å) and about 20 angstroms, as an example. A thickness of the gate dielectric layer 1002 may be between about 5 nanometer (nm) and about 25 nm, as another example.

Figure 11:
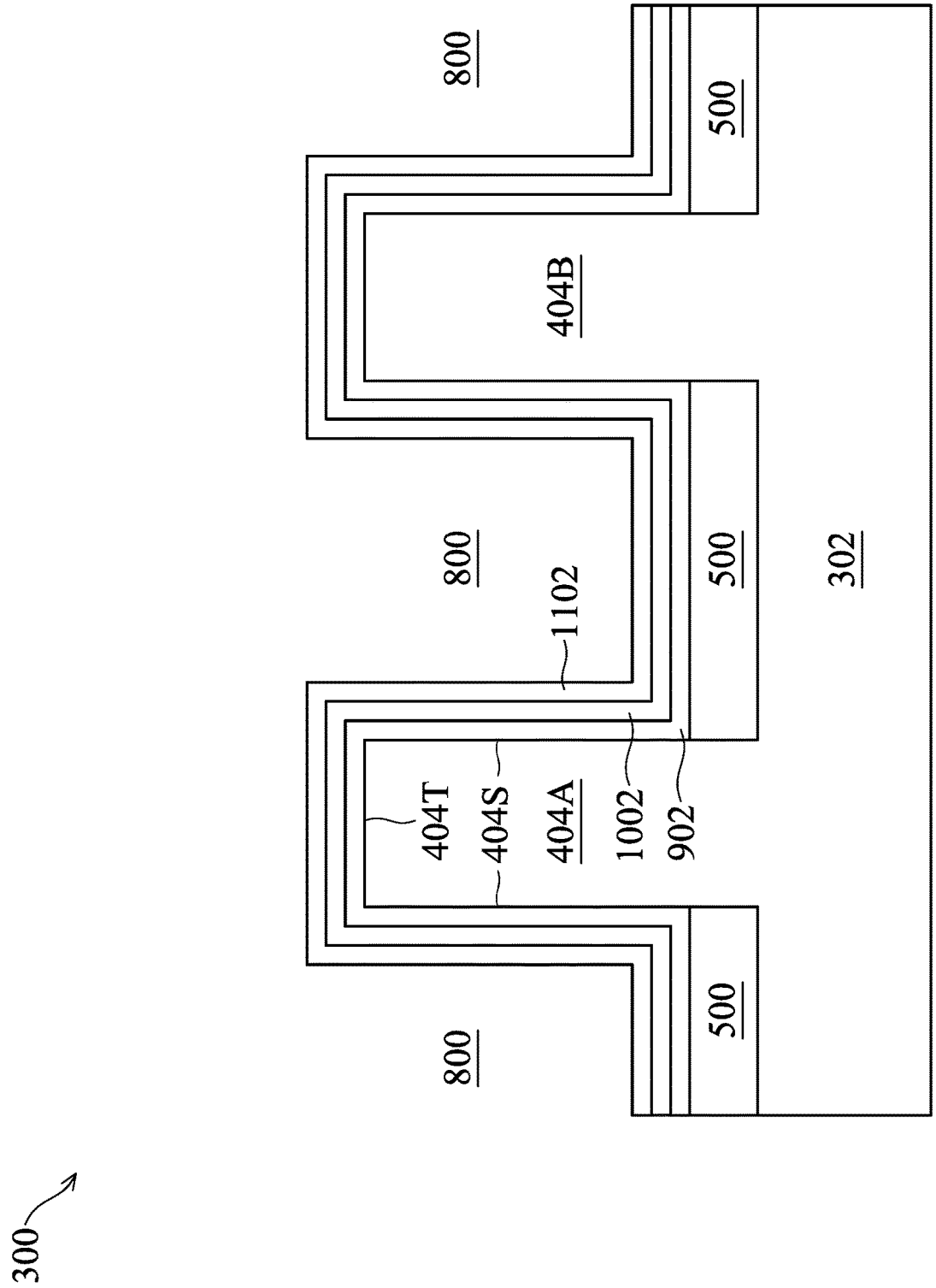

Corresponding to operation 216 of FIG. 2, FIG. 11 is a cross-sectional view of the FinFET device 300 including a work function layer 1102 at one of the various stages of fabrication. Although one work function layer (e.g., 1102) is shown, it should be understood that any number of work function layers can be formed over the fin structures 404A and 404B while remaining within the scope of the present disclosure. The cross-sectional view of FIG. 11 is cut along the lengthwise direction of a dummy or an active gate structure (e.g., cross-section B-B, as indicated in FIG. 1).

The work function layer 1102 is deposited (e.g., conformally) in the gate trench 800 over the fin structures 404A and 404B, with the gate dielectric layer 1002 and the interfacial layer 902 sandwiched therebetween. In some embodiments, the work function layer 1102 may include a metal oxide of Hf, Al, Zr, La, Mg, Ba, Ti, Pb, or combinations thereof (e.g., LaO, AlOx). In some embodiments, the work function layer 1102 may be a P-type work function layer, an N-type work function layer, multi-layers thereof, or combinations thereof. In the discussion herein, a work function layer may also be referred to as a work function metal. Example P-type work function metals include TiN, TaN, Ru, Mo, Al, WN, $ZrSi_2$, $MoSi_2$, $TaSi_2$, $NiSi_2$, WCN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. The work function layer(s) may be deposited by CVD, physical vapor deposition (PVD), ALD, and/or other suitable process. A thickness of a P-type work function layer may be between about 8 Å and about 15 Å, and a thickness of an N-type work function layer may be between about 15 Å and about 30 Å, as an example. A thickness of a P-type work function layer may be between about 5 nanometer (nm) and about 25 nm, and a thickness of an N-type work function layer may be between about 5 nm and about 25 nm, as another example.

Figure 12:
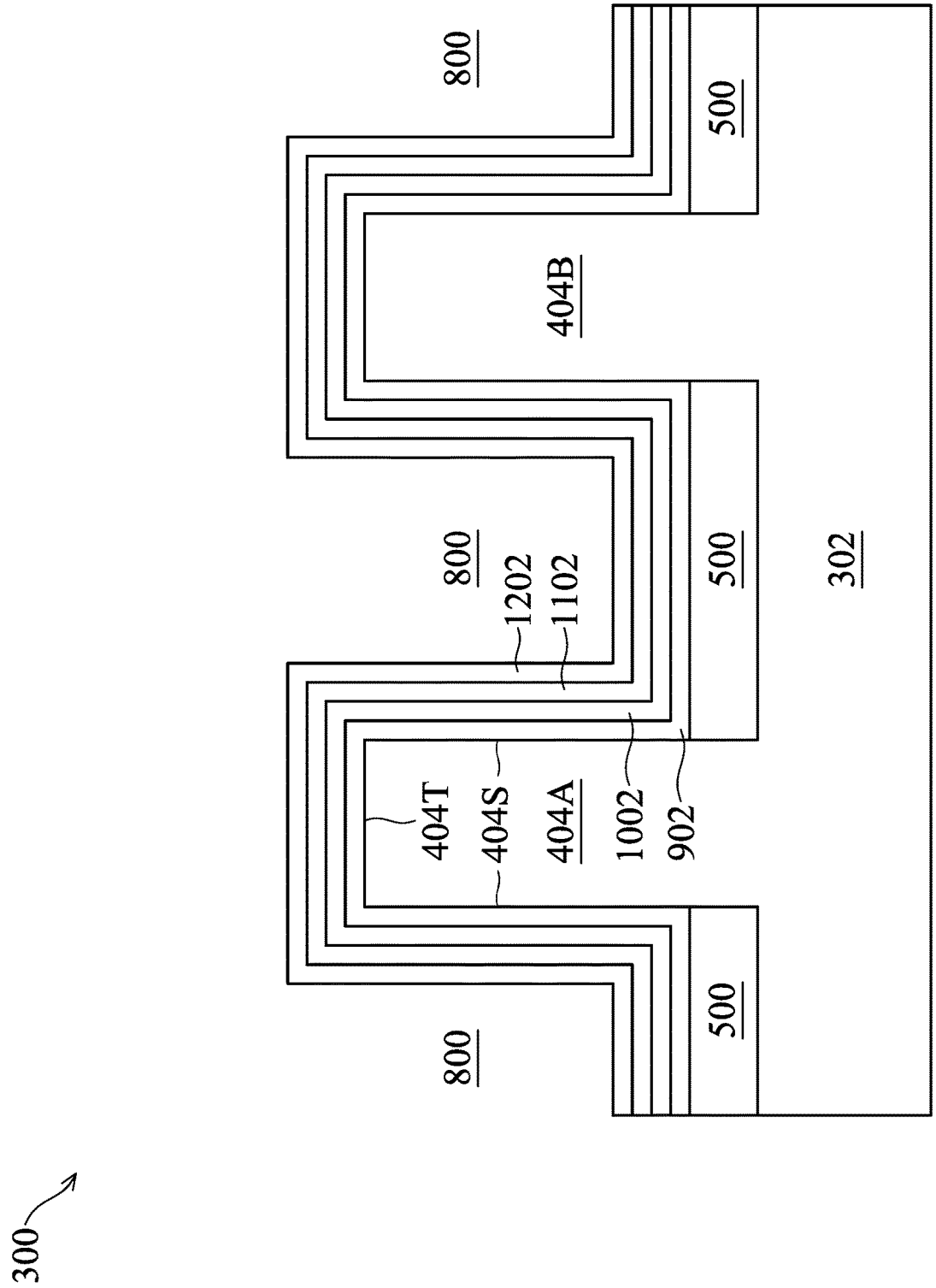

Corresponding to operation 218 of FIG. 2, FIG. 12 is a cross-sectional view of the FinFET device 300 including a metal-containing hardmask layer 1202 at one of the various stages of fabrication. The cross-sectional view of FIG. 12 is cut along the lengthwise direction of a dummy or an active gate structure (e.g., cross-section B-B, as indicated in FIG. 1).

The metal-containing hardmask layer 1202 is deposited (e.g., conformally) in the gate trench 800 over the fin structures 404A and 404B, with the work function layer 1102, the gate dielectric layer 1002, and the interfacial layer 902 sandwiched therebetween. Similar as the work function layer 1102, the hardmask layer 1202 may be configured to achieve threshold voltages for FinFETs that adopt the fin structures 404A and 404B as their channels, respectively. The hardmask layer 1202 is sometimes referred to as a topmost work function layer. In some embodiments, the hardmask layer 1202 may include a metal oxide of Hf, Al, Zr, La, Mg, Ba, Ti, Pb, or combinations thereof (e.g., LaO, AlOx). As such, the hardmask layer 1202 can include metal atoms (e.g., Al) exposed on its top surface. The hardmask layer 1202 may be deposited by CVD, physical vapor deposition (PVD), ALD, and/or other suitable process.

Figure 13:
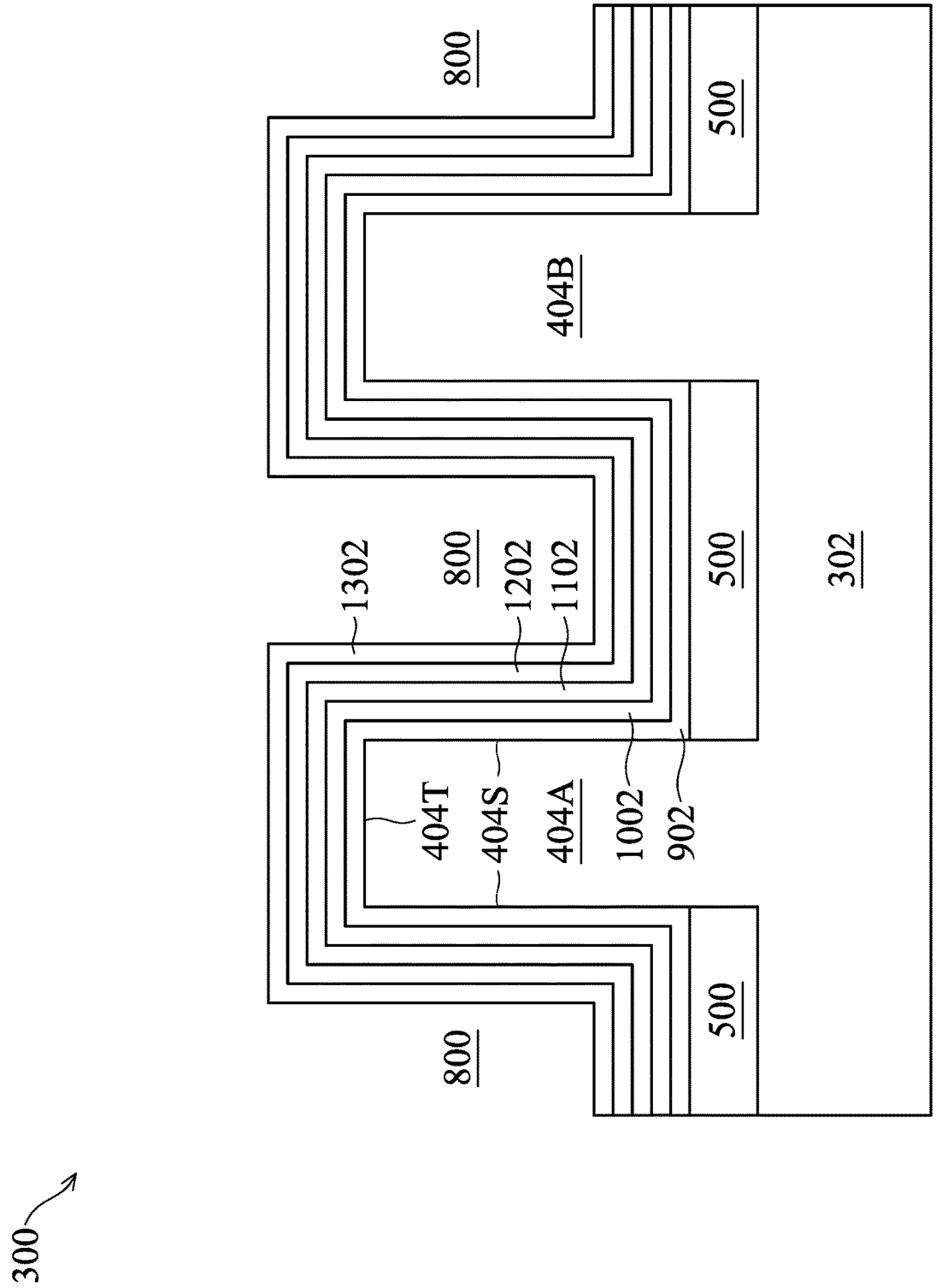

Corresponding to operation 220 of FIG. 2, FIG. 13 is a cross-sectional view of the FinFET device 300 including an adhesion layer 1302 at one of the various stages of fabrication. The cross-sectional view of FIG. 13 is cut along the lengthwise direction of a dummy or an active gate structure (e.g., cross-section B-B, as indicated in FIG. 1).

Figure 17A:
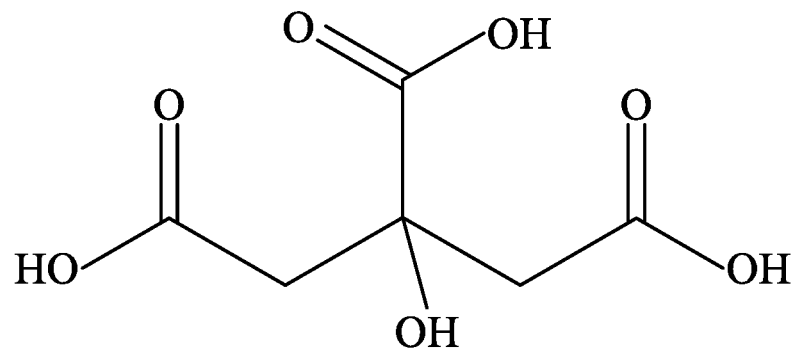
FIGS. 17A and 17B respectively illustrate the examples of an adhesion layer, used in the method of FIG. 2, in accordance with some embodiments.
Figure 17B:
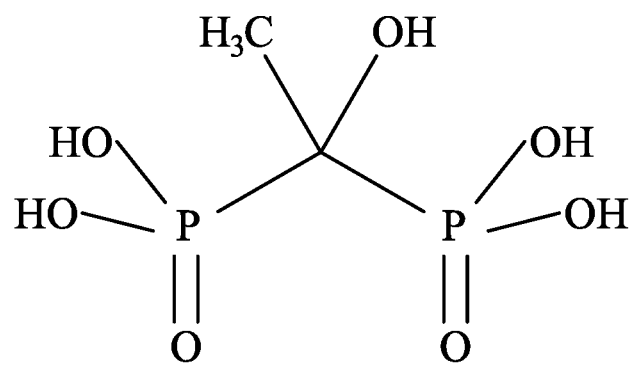

The adhesion layer 1302 is deposited (e.g., conformally) in the gate trench 800 over the fin structures 404A and 404B, with the hardmask layer 1202, the work function layer 1102, the gate dielectric layer 1002, and the interfacial layer 902 sandwiched therebetween. The adhesion layer 1302 includes an organic acid that can concurrently bond the metal atoms of the hardmask layer 1202 and the phenol groups of a patternable layer, which will be later deposited over the adhesion layer 1302. Specifically, the adhesion layer 1302 can include carboxylic acid (—COOH) and at least one of a hydroxy group (—OH) or amine (—NH2), such that the adhesion layer 1302 can concurrently bond to the metal atoms of the hardmask layer 1202 via the carboxylic acid, and to the phenol groups of the patternable layer via the hydroxy group/amine. For example, the adhesion layer 1302 includes a citric acid, as shown in FIG. 17A. In another example, the adhesion layer 1302 includes an etidronic acid (which is also referred to as 1-Hydroxyethylidene-1,1-diphosphonic acid (HEDP) acid), as shown in FIG. 17B. The formation methods of adhesion layer 1302 may include a spin-coating technique, and the like. For example, the adhesion layer 1302 (with a concentration between about 1:1 and about 1:20) may be spun on the partially fabricated workpiece under a temperature (e.g., between about the room temperature and about 45° C.). A thickness of the adhesion layer 1302 may be between about 1 nm and about 5 nm, as an example.

Figure 14:
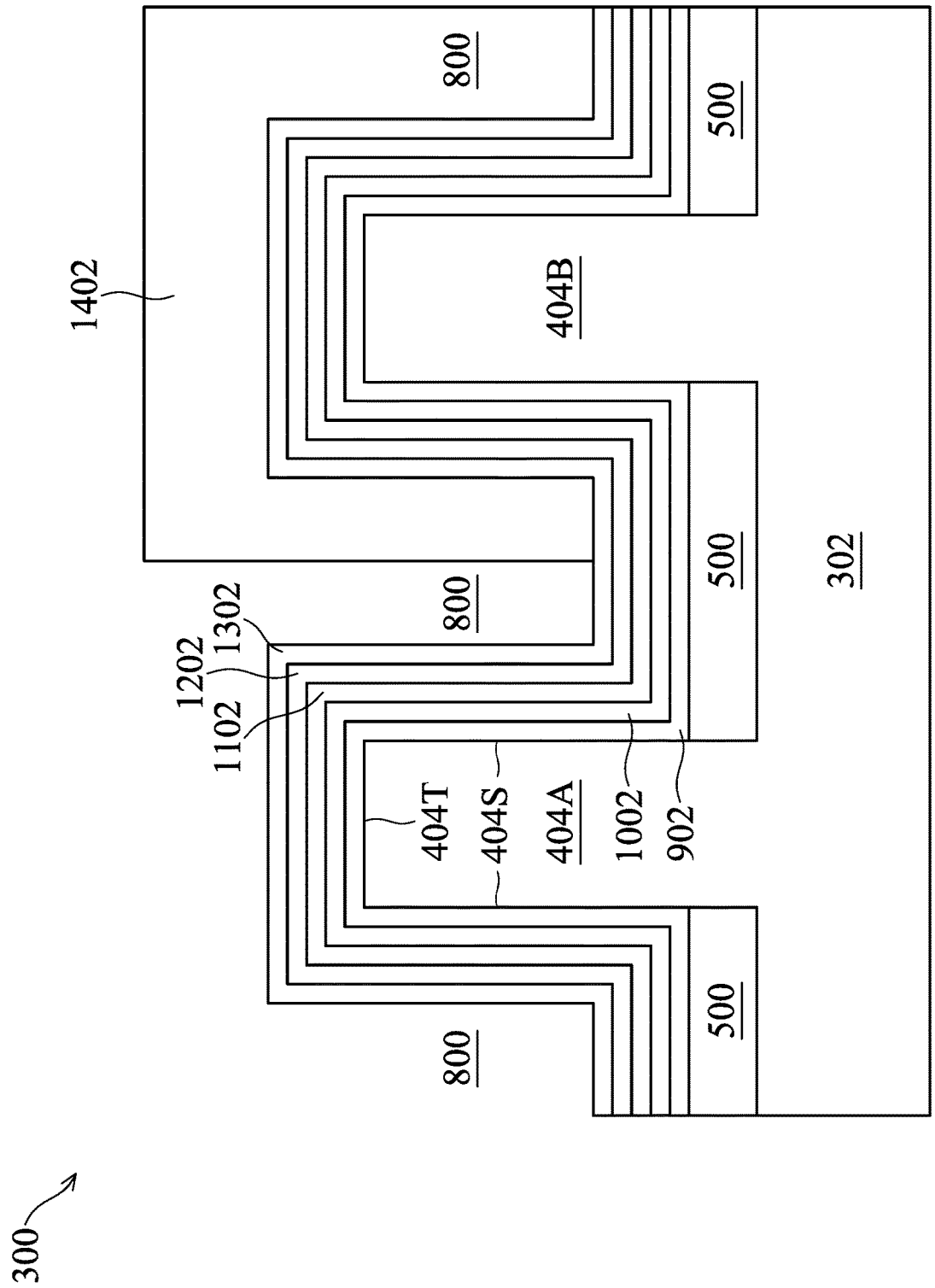

Corresponding to operation 222 of FIG. 2, FIG. 14 is a cross-sectional view of the FinFET device 300 including a patternable (or patterned) layer 1402 at one of the various stages of fabrication. The cross-sectional view of FIG. 14 is cut along the lengthwise direction of a dummy or an active gate structure (e.g., cross-section B-B, as indicated in FIG. 1).

Figure 18:
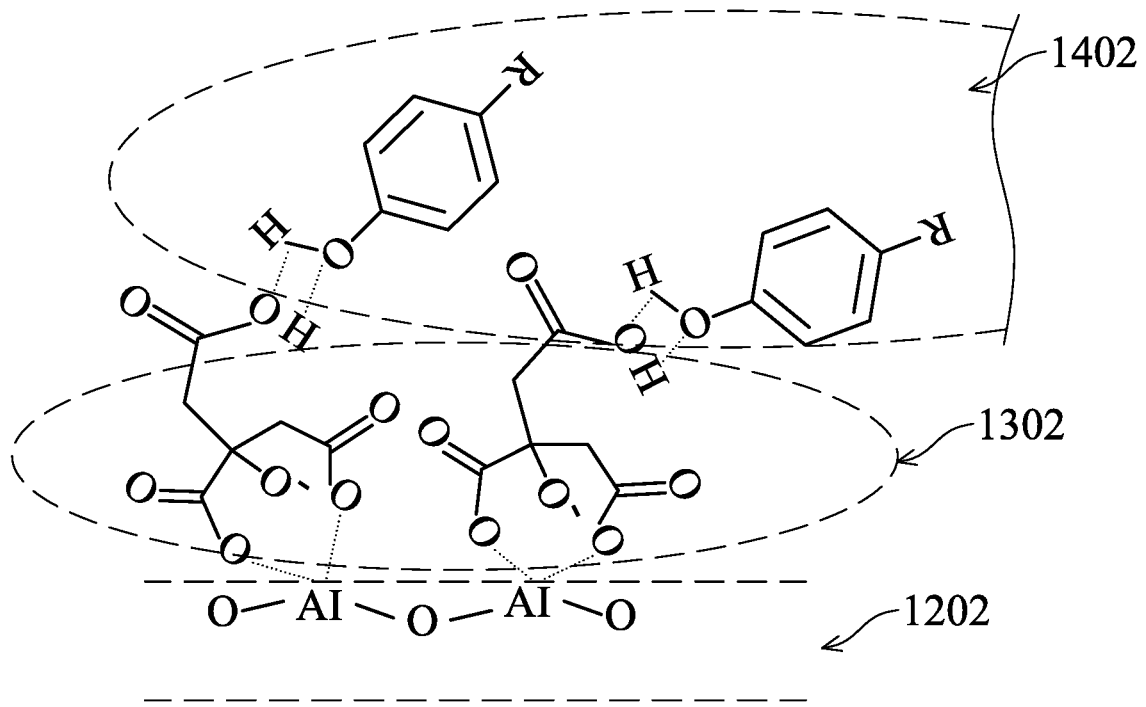
FIG. 18 illustrates a bonding mechanism between a metal-containing hardmask layer and a patternable layer, used in the method of FIG. 2, in accordance with some embodiments.

The patternable layer 1402 is first deposited over the fin structures 404A and 404B, followed by one or more patterning processes to form the patterned layer 1402, which overlays the multiple layers over the fin structure 404B, as shown in the illustrated example of FIG. 14. The patternable layer 1402 includes an anti-reflective coating, which can be implemented as a bottom anti-reflective coating (BARC) layer, for example. Such an anti-reflective coating may include a phenol group, in some embodiments. With the adhesion layer 1302 disposed between the hardmask layer 1202 and the patternable layer 1402, the carboxylic acid of the adhesion layer 1302 can bond to the metal atoms of the hardmask layer 1202, and the hydroxy group/amine of the adhesion layer 1302 can bond to the phenol group of the patternable layer 1402. For example in FIG. 18 where the hardmask layer 1202 includes AlOx and the adhesion layer 1302 include a citric acid, the carboxylic acid of the adhesion layer 1302 can bond to the metal atoms (e.g., Al) of the hardmask layer 1202 via a number of chelating bonds and to the phenol groups of the patternable layer 1402 via a number of hydrogen bonds.

The anti-reflective coating is generally used to facilitate photolithography processes by controlling reflectivity. For example, the anti-reflective coating can control reflectivity through careful selection of material to control a refractive index of the anti-reflective coating as well as a thickness of the anti-reflective coating. The anti-reflective coating can be formed using a variety of materials such as silicon oxide, silicon nitride, silicon oxynitride, amorphous carbon, titanium oxide, titanium oxynitride, and other suitable materials and combinations thereof. The anti-reflective coating can be formed using a variety of suitable processes, such as CVD, PVD, electrochemical deposition, ALD, other suitable processes, or combinations thereof.

Upon depositing the patternable layer 1402, a tri-layer resist patterning scheme, for example, may be utilized to pattern the patternable layer 1402. For example, one top of the patternable layer 1402 (which functions as a BARC), a middle imaging (or patternable) layer and an upper imaging (or patternable) layer can be formed. However, it should be understood that other patterning layer schemes, such as a single imaging layer, may be used while remaining within the scope of the present disclosure. Next, one or more (e.g., dry) etching processes are then performed to remove a portion of the patternable layer 1402 that overlays the fin structure 404A, as shown in the illustrated example of FIG. 14.

Figure 15:
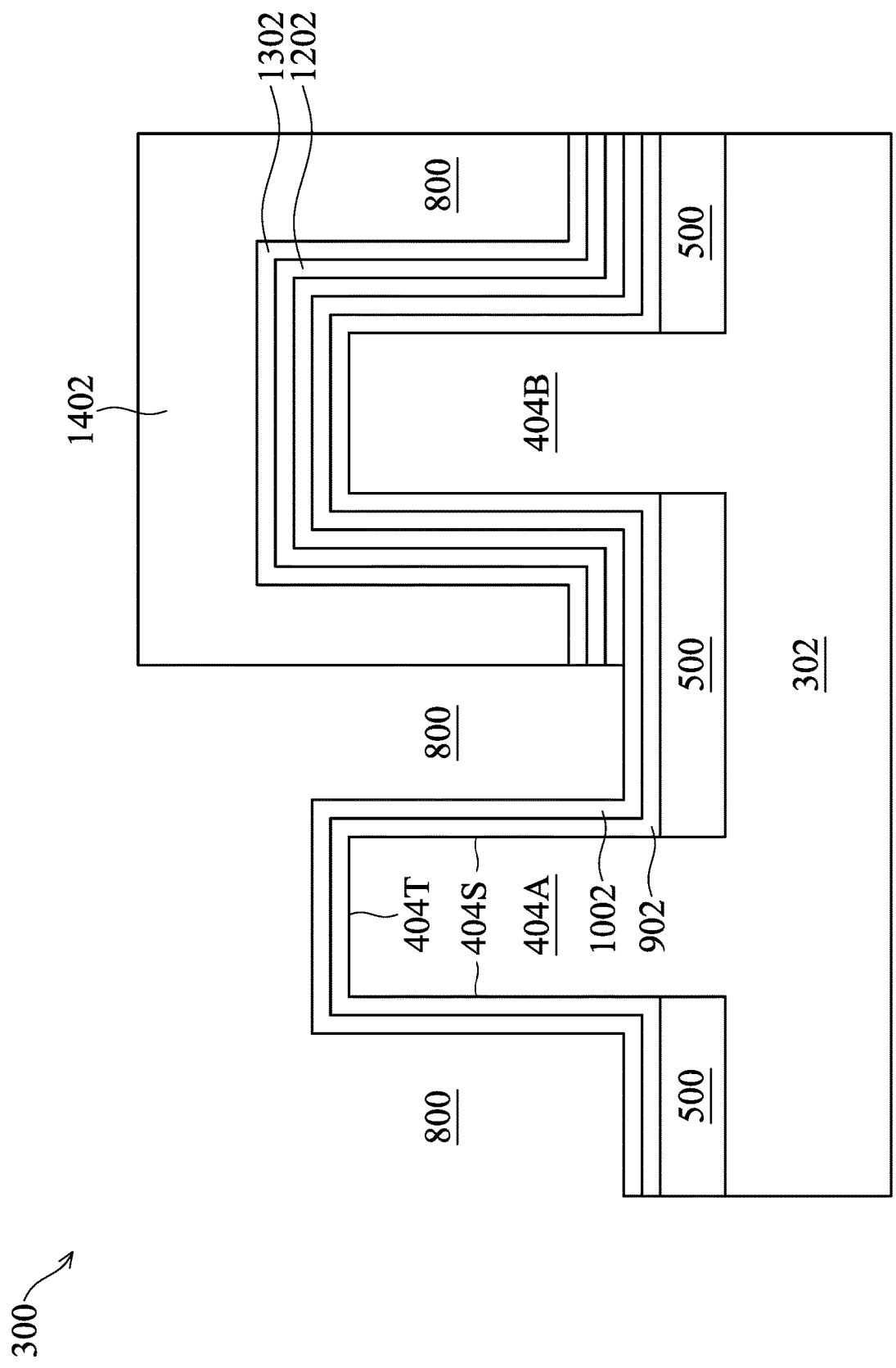

Corresponding to operation 224 of FIG. 2, FIG. 15 is a cross-sectional view of the FinFET device 300 including different combinations of the work function layer 1202 and/or the hardmask (top work function) layer 1302 over the fin structures 404A and 404B, respectively, at one of the various stages of fabrication. The cross-sectional view of FIG. 15 is cut along the lengthwise direction of a dummy or an active gate structure (e.g., cross-section B-B, as indicated in FIG. 1). Although two work function layers are shown to constitute different combinations over the fin structures 404A-B, it should be understood that each of the combinations can have any desired number of work function layers, while remaining within the scope of the present disclosure.

To form the different combinations of work function layers, one or more (e.g., wet) etching processes are performed to remove a portion of the adhesion layer 1302, a portion of the hardmask layer 1202, and a portion of the work function layer 1102 that are not overlaid by the patterned layer 1402 (e.g., the portions that overlay the fin structure 404A in the current example). The wet etching process is performed using a chemical comprising a mixture of ammonium hydroxide ($NH_4OH$) and hydrochloric acid (HCl). With the adhesion layer 1302 bonding the patterned layer 1402 to the metal-containing hardmask layer 1202 more firmly, it can advantageously complicate the penetration of the chemical into the patterned layer 1402. As a result, damage to the work function layer that is desired to remain overlaying the fin structure 404B can be minimized.

Figure 16:
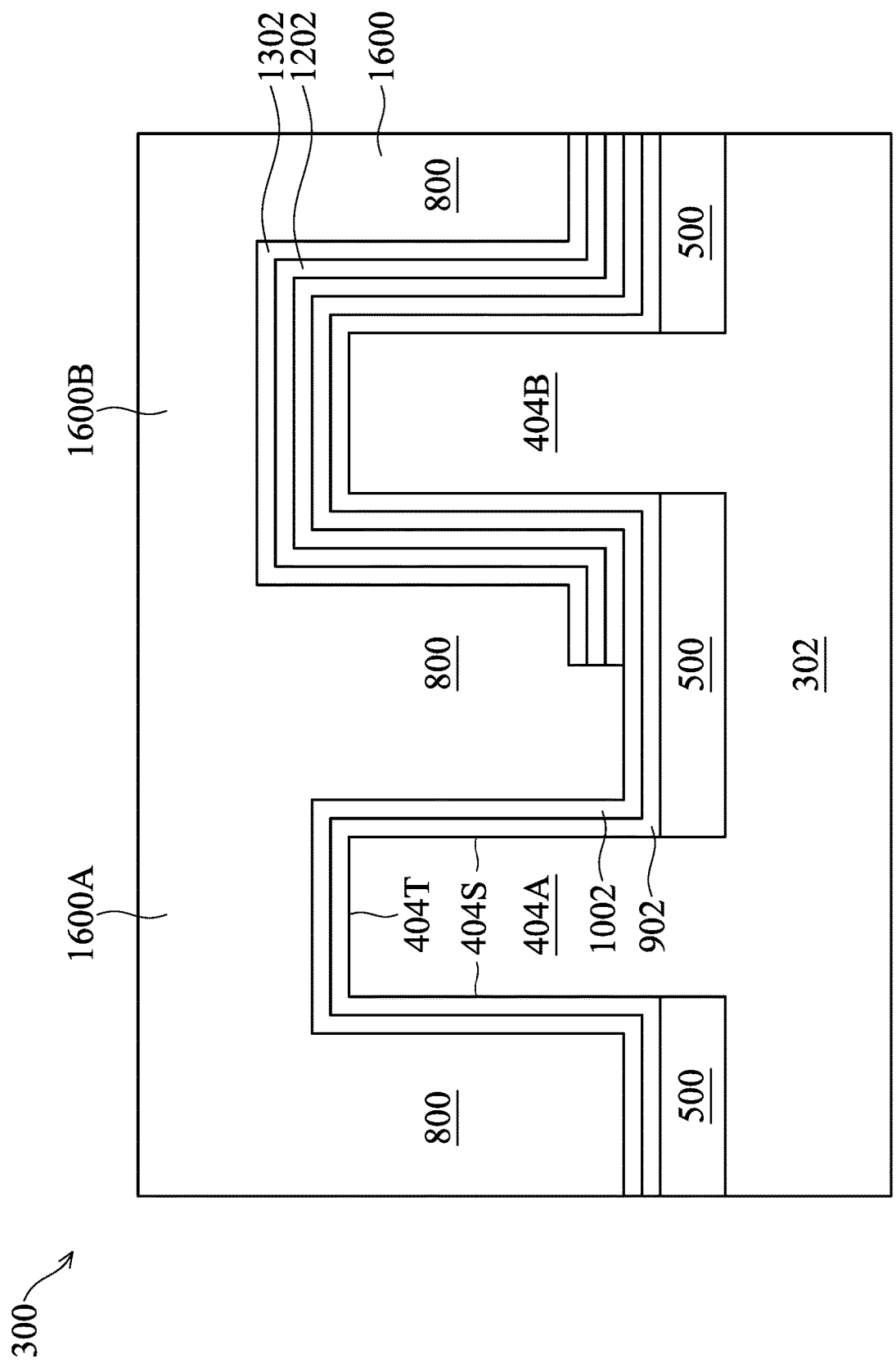

Corresponding to operation 226 of FIG. 2, FIG. 16 is a cross-sectional view of the FinFET device 300 including a metal fill 1600 at one of the various stages of fabrication. The cross-sectional views of FIG. 16 is cut along the lengthwise direction of a dummy or an active gate structure (e.g., cross-section B-B, as indicated in FIG. 1).

The metal fill 1600 can fill the gate trench 800 to form active gate structures 1600A and 1600B straddling the fin structures 404A and 404B, respectively. For example, the active gate structure 1600A includes the metal fill 1600 and the combination of the work function layer(s)(e.g., none of the work function layer 1102 or the hardmask layer 1202 in the present example), with the gate dielectric layer 1002 (and the interfacial layer 902) disposed between it and the fin structure 404A that is configured as a channel; and the active gate structure 1600B includes the metal fill 1600 and the combination of the work function layer(s) (e.g., both the work function layer 1102 and the hardmask layer 1202 in the present example), with the gate dielectric layer 1002 (and the interfacial layer 902) disposed between it and the fin structure 404B that is configured as a channel. The metal fill 1600 may include a suitable metal, such as tungsten (W), formed by a suitable method, such as PVD, CVD, electroplating, electroless plating, or the like. Besides tungsten, other suitable material, such as copper (Cu), gold (Au), cobalt (Co), combinations thereof, multi-layers thereof, alloys thereof, or the like, may also be used as the metal fill 1600.

In one aspect of the present disclosure, a method for manufacturing a semiconductor device is disclosed. The method includes forming one or more work function layers over a semiconductor structure. The method includes forming a hardmask layer over the one or more work function layers. The hardmask layer includes a material formed by metal atoms. The method includes forming an adhesion layer over the hardmask layer. The method includes removing a first portion of a patternable layer that is disposed over the hardmask layer. The patternable layer includes a phenol group. The adhesion layer comprises an organic acid that concurrently bonds metal atoms of the hardmask layer and phenol groups of the patternable layer, thereby preventing an etchant from penetrating into a second portion of the patternable layer that still remains over the hardmask layer.

In another aspect of the present disclosure, a method for manufacturing a semiconductor device is disclosed. The method includes forming a first fin structure and a second fin structure over a substrate. The method includes forming at least work function layer over the first and second fin structures. The method includes forming a hardmask layer over the at least one work function layer. The method includes forming an adhesion layer over the hardmask layer, wherein the adhesion layer comprises an organic acid. The method includes forming a patternable layer over the adhesion layer. The method includes removing a first portion of the patternable layer that is disposed over the first fin structure to expose a first portion of the hardmask layer disposed over the first fin structure, while remaining a second portion of the patternable layer disposed over the second fin structure. The method includes removing the first portion of the hardmask layer and a first portion of the at least one work function layer exposed by the first portion of the hardmask layer, with the adhesion layer bonding together the second portion of the patternable layer and a second portion of the hardmask layer over the second fin structure.

In yet another aspect of the present disclosure, a method for manufacturing a semiconductor device is disclosed. The method includes forming a first fin structure and a second fin structure over a substrate. The method includes forming a first gate trench and a second gate trench over the first fin structure and the second fin structure, respectively. The method includes forming a gate dielectric layer in the first and second gate trenches. The method includes forming a work function layer over the gate dielectric layer. The method includes forming a hardmask layer over the work function layer, wherein the hardmask layer comprises metal atoms. The method includes forming an adhesion layer over the hardmask layer, wherein the adhesion layer comprises. The method includes forming a patternable layer over the adhesion layer, wherein the patternable layer comprises phenol groups. The adhesion layer comprises an organic acid configured to strengthen bonding between the hardmask layer and the patternable layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for manufacturing a semiconductor device, comprising:
    forming one or more work function layers over a semiconductor structure;

forming a hardmask layer over the one or more work function layers, wherein the hardmask layer comprises a material formed by metal atoms;

forming an adhesion layer over the hardmask layer; and removing a first portion of a patternable layer that is disposed over the hardmask layer, wherein the patternable layer comprises phenol groups;

wherein the adhesion layer comprises an organic acid that concurrently bonds metal atoms of the hardmask layer and phenol groups of the patternable layer, thereby preventing an etchant from penetrating into a second portion of the patternable layer that still remains over the hardmask layer.

2. The method of claim 1, wherein the metal atoms include aluminum atoms.

3. The method of claim 1, wherein the adhesion layer includes a carboxylic acid and a hydroxy group, and wherein the carboxylic acid is configured to bond to the metal atoms and the hydroxy group is configured to bond to the phenol groups.

4. The method of claim 1, wherein the adhesion layer includes a carboxylic acid and an amine group, and wherein the carboxylic acid is configured to bond to the metal atoms and the amine group is configured to bond to the phenol groups.

5. The method of claim 1, wherein the step of forming an adhesion layer over the hardmask layer further comprises spin coating the adhesion layer over the hardmask layer.

6. The method of claim 1, wherein the step of forming an adhesion layer over the hardmask layer is performed at a temperature between a room temperature and an elevated temperature that is about 40° C.

7. The method of claim 1, further comprising:
removing, using the etchant, a portion of the hardmask layer that is exposed by the removed first portion of the patternable layer; and
removing, using the etchant, respective portions of the one or more work function layers that are exposed by the removed portion of the hardmask layer.

8. The method of claim 1, wherein the etchant includes a wet etching solution selected from the group consisting of: $NH_4OH$, $HCl$, $H_2SO_4$, $H_3PO_4$, $HNO_3$, and combinations thereof.

9. A method for manufacturing a semiconductor device, comprising:
forming a first fin structure and a second fin structure over a substrate;
forming at least one work function layer over the first and second fin structures;
forming a hardmask layer over the at least one work function layer;
forming an adhesion layer over the hardmask layer, wherein the adhesion layer comprises an organic acid;
forming a patternable layer over the adhesion layer;
removing a first portion of the patternable layer that is disposed over the first fin structure to expose a first portion of the hardmask layer disposed over the first fin structure, while remaining a second portion of the patternable layer disposed over the second fin structure; and
removing the first portion of the hardmask layer and a first portion of the at least one work function layer exposed by the first portion of the hardmask layer, with the adhesion layer bonding together the second portion of the patternable layer and a second portion of the hardmask layer over the second fin structure.

10. The method of claim 9, wherein the step of removing a first portion of the patternable layer comprises performing a dry etching process.

11. The method of claim 9, wherein the step of removing the first portion of the hardmask layer and a first portion of the at least one work function layer comprises performing a wet etching process.

12. The method of claim 11, wherein the wet etching process comprises applying a wet etching solution over the second portion of the patternable layer and the first portion of the hardmask layer, the wet etching solution selected from the group consisting of:
$NH_4OH$, $HCl$, $H_2SO_4$, $H_3PO_4$, $HNO_3$, and combinations thereof.

13. The method of claim 9, wherein the organic acid of the adhesion layer includes a carboxylic acid and a hydroxy group, and wherein the carboxylic acid is configured to bond to metal atoms of the hardmask layer and the hydroxy group is configured to bond to phenol groups of the patternable layer.

14. The method of claim 9, wherein the organic acid of the adhesion layer includes a carboxylic acid and an amine group, and wherein the carboxylic acid is configured to bond to metal atoms of the hardmask layer and the amine group is configured to bond to phenol groups of the patternable layer.

15. The method of claim 9, wherein the step of forming an adhesion layer over the hardmask layer further comprises spin coating the adhesion layer over the hardmask layer.

16. The method of claim 9, wherein the step of forming an adhesion layer over the hardmask layer is performed at a temperature between a room temperature and an elevated temperature that is about 40° C.

17. A method for manufacturing a semiconductor device, comprising:
forming a first fin structure and a second fin structure over a substrate;
forming a first gate trench and a second gate trench over the first fin structure and the second fin structure, respectively;
forming a gate dielectric layer in the first and second gate trenches;
forming a work function layer over the gate dielectric layer;
forming a hardmask layer over the work function layer, wherein the hardmask layer comprises metal atoms;
forming an adhesion layer over the hardmask layer; and
forming a patternable layer over the adhesion layer, wherein the patternable layer comprises phenol groups;
wherein the adhesion layer comprises an organic acid configured to strengthen bonding between the hardmask layer and the patternable layer.

18. The method of claim 17, wherein the organic acid of the adhesion layer includes a carboxylic acid and a hydroxy group, and wherein the carboxylic acid is configured to bond to the metal atoms of the hardmask layer and the hydroxy group is configured to bond to the phenol groups of the patternable layer.

19. The method of claim 17, wherein the organic acid of the adhesion layer includes a carboxylic acid and an amine group, and wherein the carboxylic acid is configured to bond to the metal atoms of the hardmask layer and the amine group is configured to bond to the phenol groups of the patternable layer.

20. The method of claim 17, further comprising:
dry etching a first portion of the patternable layer in the first gate trench to expose a first portion of the hardmask layer in the first gate trench, while remaining a second portion of the patternable layer in the second gate trench; and wet etching the first portion of the hardmask layer and a first portion of the work function layer exposed by the first portion of the hardmask layer, while the adhesion layer bonds together the second portion of the patternable layer and a second portion of the hardmask layer in the second gate trench, thereby protecting the second portion of the hardmask layer and a second portion of the work function layer in the second gate trench from the wet etching.

\* \* \* \* \*